US009448488B2

(12) United States Patent
Zhang et al.

(10) Patent No.: US 9,448,488 B2
(45) Date of Patent: Sep. 20, 2016

(54) OFF-AXIS ALIGNMENT SYSTEM AND ALIGNMENT METHOD

(71) Applicant: Shanghai Micro Electronics Equipment Co., Ltd., Shanghai (CN)

(72) Inventors: Pengli Zhang, Shanghai (CN); Wen Xu, Shanghai (CN); Fan Wang, Shanghai (CN)

(73) Assignee: SHANGHAI MICRO ELECTRONICS EQUIPMENT CO., LTD., Shanghai (CN)

( * ) Notice: Subject to any disclaimer, the term of this patent is extended or adjusted under 35 U.S.C. 154(b) by 6 days.

(21) Appl. No.: 14/434,079

(22) PCT Filed: Aug. 5, 2013

(86) PCT No.: PCT/CN2013/080800
§ 371 (c)(1),
(2) Date: Apr. 7, 2015

(87) PCT Pub. No.: WO2014/059811
PCT Pub. Date: Apr. 24, 2014

(65) Prior Publication Data
US 2015/0261098 A1 Sep. 17, 2015

(30) Foreign Application Priority Data
Oct. 19, 2012 (CN) .......................... 2012 1 0402248

(51) Int. Cl.
*G03F 7/20* (2006.01)
*G03F 9/00* (2006.01)
(52) U.S. Cl.
CPC ......... *G03F 7/70141* (2013.01); *G03F 9/7046* (2013.01); *G03F 9/7069* (2013.01); *G03F 9/7088* (2013.01)

(58) Field of Classification Search
CPC ............. G03F 7/70141; G03F 9/7046; G03F 9/7069; G03F 9/7088
See application file for complete search history.

(56) References Cited

U.S. PATENT DOCUMENTS 4,784,490 A * 11/1988 Wayne ............... G01B 9/02007
356/487
4,912,530 A * 3/1990 Bessho ..................... G01J 9/04
356/487

(Continued)

FOREIGN PATENT DOCUMENTS

CN 101165597 A 4/2008
CN WO 2008052405 A1 * 5/2008 ........... G03F 9/7049

(Continued)

*Primary Examiner* — Steven H Whitesell Gordon
(74) *Attorney, Agent, or Firm* — Muncy, Geissler, Olds & Lowe, P.C.

(57) ABSTRACT

An off-axis alignment system includes, sequentially along a transmission path of a light beam, an illumination module (10), an interference module (20) and a detection module (30). The interference module (20) includes: a polarization beam splitter (21) having four side faces, the illumination module (10) and the detection modules (30) both located on a first side of the polarization beam splitter (21); a first quarter-wave plate (22) and a first reflector (23), sequentially disposed on a second side opposite to the first side; and a second quarter-wave plate (24) and a cube-corner prism (25), sequentially disposed on a third side of the polarization beam splitter (21); and a third quarter-wave plate (26), a second reflector (27) and a lens (28), sequentially disposed on a fourth side of the polarization beam splitter (21). The second reflector (27) is located on a rear focal plane of the lens (28). A center of a bottom of the cube-corner prism (25) is situated on an optical axis of the lens (28). An off-axis alignment method is also disclosed.

16 Claims, 10 Drawing Sheets

(56) References Cited

U.S. PATENT DOCUMENTS

| | | | |
|---|---|---|---|
| 4,938,598 A | 7/1990 | Akiyama et al. | |
| 6,297,876 B1* | 10/2001 | Bornebroek | G03F 9/70 355/53 |
| 6,628,406 B1* | 9/2003 | Kreuzer | G03F 7/70358 356/508 |
| 2002/0171844 A1* | 11/2002 | Hill | G03F 7/70775 356/500 |
| 2004/0033426 A1* | 2/2004 | Den Boef | G03B 27/32 430/22 |
| 2005/0110971 A1* | 5/2005 | Maria Beems | G03F 7/70941 355/53 |
| 2006/0039006 A1* | 2/2006 | Van Der Pasch | G02B 5/122 356/493 |
| 2009/0109442 A1* | 4/2009 | Felix | G01J 3/02 356/491 |
| 2011/0085726 A1 | 4/2011 | Den Boef et al. | |
| 2012/0212749 A1* | 8/2012 | Den Boef | G02B 21/0048 356/615 |
| 2013/0114087 A1* | 5/2013 | Deck | G01B 9/0209 356/486 |
| 2013/0120733 A1* | 5/2013 | Sakamoto | G03F 9/7046 355/77 |

FOREIGN PATENT DOCUMENTS

| | | |
|---|---|---|
| EP | 1 076 264 A2 | 2/2001 |
| JP | 2012-8004 | 1/2012 |

* cited by examiner

OFF-AXIS ALIGNMENT SYSTEM AND ALIGNMENT METHOD

TECHNICAL FIELD

The present invention relates to wafer alignment apparatuses, and more particularly to an off-axis alignment system and an off-axis alignment method thereof.

BACKGROUND

Currently, most photolithographic apparatuses incorporate alignment systems based on the interference of grating diffracted beams. Such alignment systems have the basic features that the incidence of a single-wavelength or multi-wavelength illumination light beam on a phase grating alignment mark causes the diffraction of the light beam into sub-beams of different diffraction orders, each sub-beam containing an indication about the position of the alignment mark. The sub-beams with different diffraction orders scattered from the phase grating at different angles are collected by the alignment system, and those of the same diffraction order and with different diffraction order signs (e.g., ±1, ±2 and ±3 orders) are then mutually superimposed and interfere in pairs on an image plane or pupil plane of the alignment system, generating interference signals of the respective orders. As the alignment mark is scanned, a photoelectric detector records intensity variations in the interference signals and signal processing is further involved to determine the position of a center of the alignment mark.

The existing alignment systems are represented by an off-axis alignment system available from ASML Netherlands. This alignment system utilizes both red-light and green-light sources for supplying illumination beams, and an array of optical wedges or a group of wedge plates for accomplishing the superimposition and interferometric imaging of the sub-beams of different orders from the alignment mark and for partitioning the imaging space at the image plane. Alignment signals from the red and green light beams are split by a polarization splitting prism and an output sinusoidal signal is produced by detecting the light intensity of an image of the alignment mark passed by a reference grating. However, this alignment system has the following deficiencies: firstly, the polarization splitting prism based beam-splitting system can only handle beams with two wavelengths and is unable to handle alignment signals with more than two wavelengths; secondly, the interference of the sub-beams with various diffraction orders occurs at the image plane, which will lead to large alignment errors for an alignment mark having a non-uniform reflectivity upon the occurrence of several conditions, such as rotation of the alignment mark or presence of a magnification error; lastly, the manufacturing, assembly and adjustment of the wedge array are imposed with stringent requirements to ensure desired coincidence between inclined faces of the two wedge-shaped plates of each pair for diffracting positive and negative order sub-beams of the same diffraction order in terms of shape and slope. Such requirements will lead to high engineering difficulties and high costs.

Another known off-axis alignment system is also from ASML Netherlands. This system uses a rotating self-referencing interferometer to produce two images of the alignment marker. The two images are rotated by 180° with respect to each other. Overlapping and interference of the sub-beams with different diffraction orders is arranged to take place at the pupil plane to generate interference signals. Relative phase differences of the interference signals of different orders are subsequently detected to determine an alignment position signal. This known alignment system utilizes the self-referencing interferometer taking the form of a composite prism with multiple principal cross sections which allows only small dimensional tolerances and hence imposes strict requirements on the manufacturing, assembly and adjustment of the interferometer. In addition, the prism is made up of several components glued together and such gluing is a difficult process. Furthermore, rotating a sub-beam by 180° and overlapping it with a non-rotated sub-beam to make them interfere in a desired manner requires the use of a light beam with high spatial coherence as the illumination beam for generating the sub-beams, and the process itself is of a high difficulty.

Therefore, there is an urgent need in this art for an off-axis alignment system and an associated method with no special requirement on spatial coherence of the illumination light beam, immunity of alignment results from the influence of tilting and defocusing of the alignment mark, simple optical path design, no necessity of using complex optics, and ease of construction.

SUMMARY OF THE INVENTION

It is the objective of the present invention to provide such an off-axis alignment system and method for addressing the above-described problems of the conventional systems, including the vulnerability of alignment results to alignment mark tilting and defocusing, necessary use of an illumination beam with high spatial coherence, and lack of practicability due to the use of optical wedges and other complex components.

This objective is attained by an off-axis alignment system which includes, sequentially along a transmission path of a light beam, an illumination module, an interference module and a detection module. The illumination module includes a light source, a multi-wavelength incident optical fiber and a beam splitter. The detection module includes sequentially a lens group, a polarizing means, a detection optical fiber and a photoelectric detector. The interference module includes a polarization beam splitter having four side faces. The illumination module and the detection module are both located on a first side of the polarization beam splitter. The interference module further includes: a first quarter-wave plate and a first reflector, sequentially disposed on a second side of the polarization beam splitter opposite to the first side thereof; a second quarter-wave plate and a cube-corner prism, sequentially disposed on a third side of the polarization beam splitter; and a third quarter-wave plate, a second reflector and a lens, sequentially disposed on a fourth side of the polarization beam splitter opposite to the third side thereof. The second reflector is located on a rear focal plane of the lens, and a center of a bottom of the cube-corner prism is situated on an optical axis of the lens.

Preferably, the illumination module further includes a shutter, an optical isolator and a phase modulator.

Preferably, the light source is a laser.

Preferably, the light source supplies light including at least four different wavelengths, two of which are in infrared spectrum.

Preferably, the light source is a single-frequency laser, and the beam splitter is a grating beam splitter, a fiber-optic beam splitter, or a planar light-wave circuit splitter.

Alternatively and also preferably, the light source is a dual-frequency laser, and the beam splitter is a laser frequency divider.

Preferably, the laser frequency divider is an electro-optic modulator or an acousto-optic modulator.

Preferably, the polarizing means is one selected from the group consisting of a dichroic polarizer, a multilayer-coating based regular polarization beam splitter and a birefringent beam splitter.

The present invention also provides an off-axis alignment method using the off-axis alignment system as defined above. The method includes the steps of:

emitting a laser beam with the light source, using the beam splitter to split the laser beam into illumination beams with a plurality of wavelengths and of a plurality of orders, directing the illumination light beams onto the polarization beam splitter such that each illumination light beam is split into a first sub-beam and a second sub-beam, respectively reflecting the first and second sub-beams with the first reflector and the cube-corner prism such that the reflected first and second sub-beams are symmetrical to each other with respect to the optical axis of the lens, and passing the symmetrical first and second sub-beams through the lens such that the symmetrical first and second sub-beams are incident on an alignment mark at a same angle of incidence and are diffracted by the alignment mark for a first time;

passing the diffracted sub-beams through the lens, reflecting the diffracted sub-beams with the second reflector located on the rear focal plane of the lens, and directing the reflected diffracted sub-beams again onto the alignment mark such that the reflected diffracted sub-beams are diffracted by the alignment mark for a second time;

collecting the re-diffracted sub-beams with the lens, passing the re-diffracted sub-beams through the polarization beam splitter, the cube-corner prism and the first reflector, and making the re-diffracted sub-beams mutually superimposed at a same location on an interface of the polarization beam splitter to generate an interference signal; and passing the interference signal through the lens group and the polarizing means to the photoelectric detector and using the photoelectric detector to determine a position of the alignment mark based on a phase variation of the interference signal.

From the above description, it can be understood that this invention has the following perceived advantages:

1) as the incident beam is diffracted twice by the alignment mark and the direction of the re-diffracted beam is exactly opposite to that of the incident beam, the alignment results are immune from the influence of tilting and/or defocusing of the alignment mark;

2) the use of the cube-corner prism enables the incident beam to be reflected symmetrically and rotated by 180°, thus eliminating the need for using a highly spatially coherent illumination beam; and 3) due to simple optical path design and non-use of complex optics (such as optical wedges), the inventive system has a small size and can thus be easily manipulated or integrated into other devices.

DETAILED DESCRIPTION

The above objectives, features and advantages of the present invention will become readily apparent from the following detailed description of several exemplary embodiments set forth below when taken in conjunction with the drawings.

Embodiment 1

Figure 1:
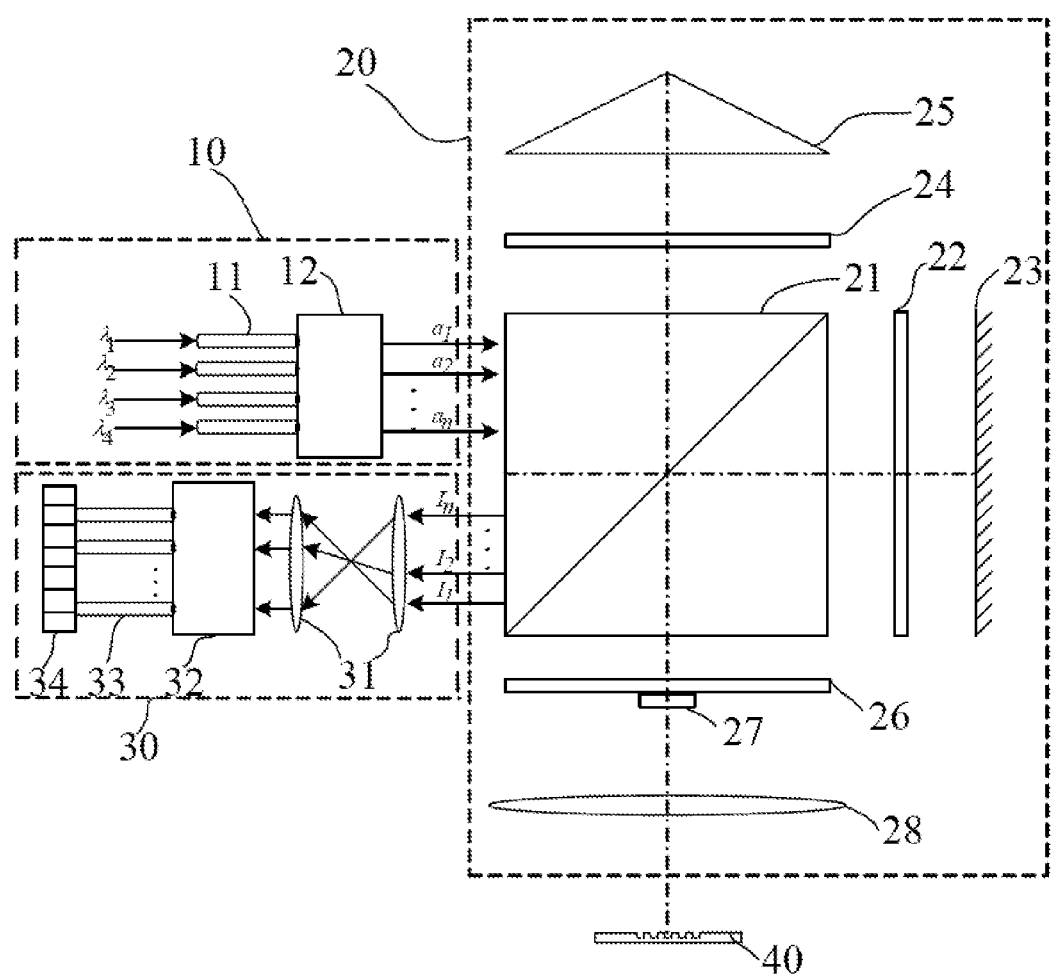
FIG. 1 is a schematic illustrating an off-axis alignment system in accordance with a first embodiment of the present invention.

FIG. 1 diagrammatically depicts an off-axis alignment system according to the present invention, which includes, sequentially along a transmission path of a light beam, an illumination module 10, an interference module 20 and a detection module 30. The illumination module 10 and the detection module 30 are located on the same side of the interference module 20. The illumination module 10 includes a light source (not shown), a multi-wavelength incident optical fiber 11 and a beam splitter 12. Preferably, the light source is implemented as a laser which can provide sufficient brightness and directivity. In the embodiment 1, the light source is a single-frequency laser for supplying a linearly-polarized light beam with single frequency. Preferably, the illumination module 10 further includes a shutter (not shown), an optical isolator (not shown) and a phase modulator (not shown). The shutter is configured to block an illumination light beam when needed; the optical isolator is configured to regulate the transmission of light beam so as to allow the light beam to travel only in one direction; and the phase modulator is configured to perform beam phase modulation to effectively inhibit the interference between unwanted light beam and signal light, thereby minimizing the contrast between interference fringes and ensuring a high signal to noise ratio. Preferably, the beam splitter 12 is a grating beam splitter, a fiber-optic beam splitter, or a planar light-wave circuit splitter. The interference module 20 includes a polarization beam splitter 21. On a side of the polarization beam splitter 21 opposite to the side thereof on which the illumination module 10 and the detection module 30 are located, sequentially disposed are a first quarter-wave plate 22 and a first reflector 23. In addition, on two further sides of the polarization beam splitter 21, respectively disposed are a second quarter-wave plate 24 and a cube-corner prism 25 sequentially, and a third quarter-wave plate 26, a second reflector 27 and a lens 28 sequentially. The second reflector 27 is situated on a rear focal plane of the lens 28, and an alignment mark 40 is arranged on the other side of the lens 28. A center of a bottom of the cube-corner prism 25 is situated on an optical axis of the lens 28. The detection module 30 sequentially includes a lens group 31, a polarizing means 32, a detection optical fiber 33 and a photoelectric detector 34. Preferably, the polarizing means 32 is one of a dichroic polarizer, a multilayer-coating based regular polarization beam splitter and a birefringent beam splitter. By way of example, the polarizing means 32 may be implemented as a Savart plate or a three-element Wollaston prism, etc. A light beam emanating from the illumination module 10 is diffracted twice in the interference module 20 and thereby forms an interference signal comprising an indication about the position of the alignment mark 40. The interference signal is then incident on the detection module 30, and the detection module 30 then determines information indicative of the position of the alignment mark 40 based on a phase variation of the interference signal.

Preferably, the light source supplies light comprising at least four different wavelengths, two of which are in the infrared spectrum, for example, $\lambda_1$=532 nm, $\lambda_2$=632.8 nm, $\lambda_3$=780 nm, and $\lambda_4$=850 nm. The use of such a multi-wavelength light source can effectively prevent destructive interference effects and result in an improvement in process adaptability. Additionally, the use of near or far infrared light for illumination can circumvent the problem of light absorption of low-k dielectric materials which happens when visible light is used, and can expand the application to the detection of polysilicon layer alignment marks wherein more intensive alignment signals will be resulted.

Figure 2:
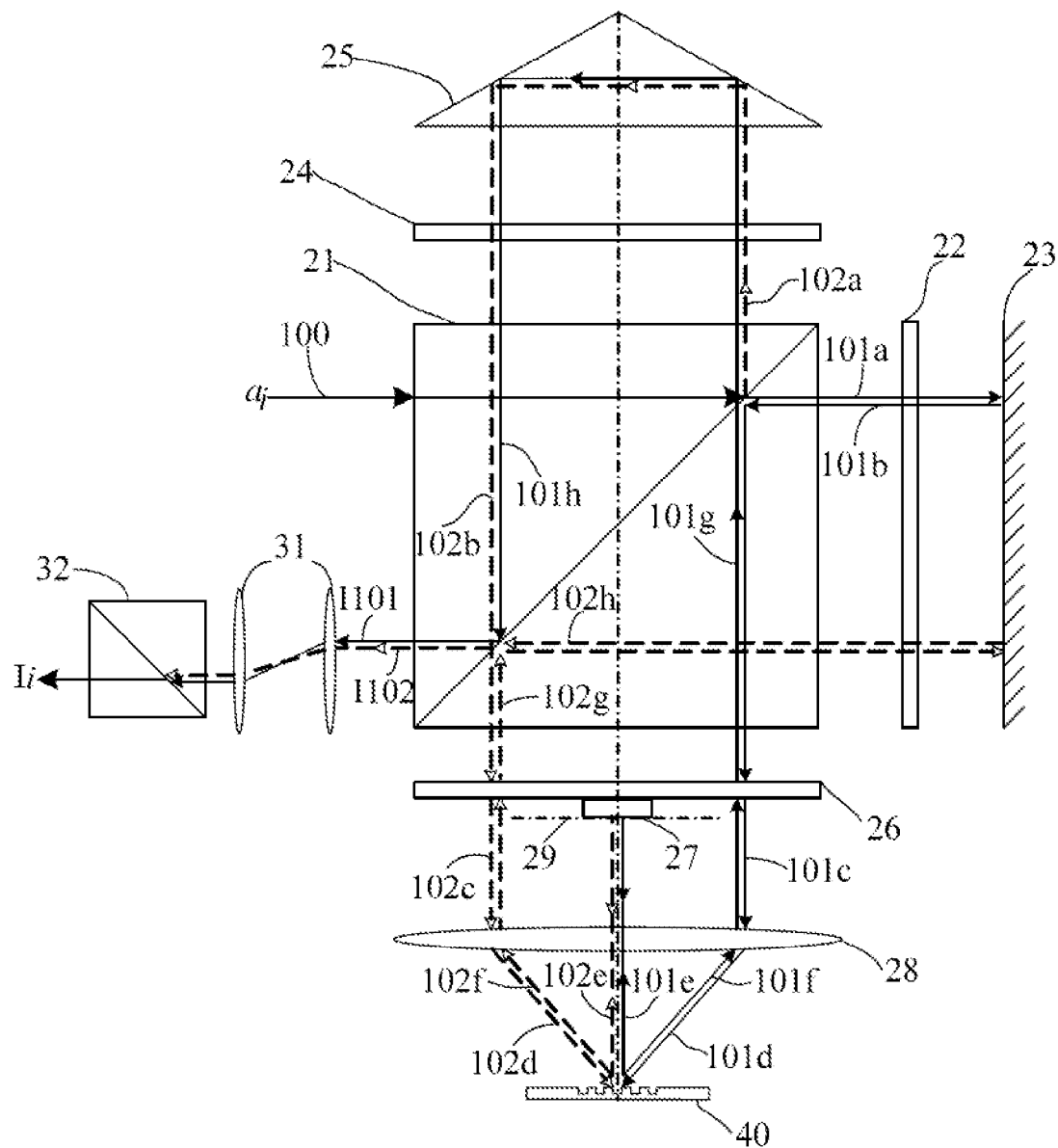
FIG. 2 depicts an optical path of the off-axis alignment system of FIG. 1.

The present invention also provides an off-axis alignment method. Referring to FIGS. 1 and 2, the method uses an off-axis alignment system as defined in the above paragraphs. The off-axis alignment method includes the following steps: the light source emits a laser beam which is transferred via the multi-wavelength incident optical fiber 11 to the beam splitter 12 and split thereby into illumination beams with different wavelengths and of different orders. In the following context, light beam 100 refers to one of the illumination beams having a certain wavelength λ and a direction of polarization rotated 45° with respect to an optical axis of the polarization beam splitter 21. The light beam 100 is directed onto the polarization beam splitter 21 and is thereby further split into first sub-beam 101a and second sub-beam 102a with mutually perpendicular directions of polarization. The first sub-beam 101a is a P-polarized light beam denoted by a solid line and a solid arrow in FIG. 2, while the second sub-beam 102a is an S-polarized light beam denoted by a dashed line and a hollow arrow in FIG. 2. The first sub-beam 101a passes through the first quarter-wave plate 22 for removal of chromatic aberrations and is then incident upon the first reflector 23. The first reflector 23 reflects the first sub-beam back to the polarization beam splitter 21 so that it enters the polarization beam splitter 21 for a second time. As the direction of polarization of the first sub-beam has been rotated by 90° and thus converted into an S-polarized beam 101b, the beam 101b is reflected by the polarization beam splitter 21 towards the third quarter-wave plate 26 and is converted into a circularly polarized light beam 101c after passing through the plate 26. The second sub-beam 102a passes through the second quarter-wave plate 24 and is converted into a P-polarized beam 102b. The P-polarized beam 102b is directed to sequentially pass through the polarization beam splitter 21 and the third quarter-wave plate 26 and is converted into a circularly polarized light beam 102c. The light beam 101c is in symmetrical to the light beam 102c with respect to the optical axis of the lens 28.

In the event of the alignment mark 40 being located on a front focal plane of the lens 28 and the alignment mark 40 being oriented perpendicular to the optical axis of the lens 28, the beams 101c and 102c transmit through the lens 28 and are thereby converted to beams 101d and 102d, respectively. The beams 101d and 102d then converge on the alignment mark 40 symmetrically with the same angle of incidence which is equal to the diffraction angle θ of a certain diffraction order of the alignment mark 40, thus generating diffracted beams 101e and 102e of the specific diffraction order which leave the alignment mark 40 in a direction perpendicular to the alignment mark 40. The diffracted beams 101e and 102e are then reflected by the reflector 27 which is located on the rear focal plane 29 of the lens 28 back to the alignment mark 40 and are hence further diffracted thereby for a second time into re-diffracted beams 101f and 102f. In an ideal case, the re-diffracted beams 101f and 102f have optical paths that totally coincide with and are opposite in direction to those of the beams 101d and 102d. For the sake of clarity, the light beams with overlapping and opposite optical paths are represented by separate lines in FIG. 2.

Here, the beams 101c and 102c converged on the alignment mark 40 are both circularly polarized incident beams. When the period of the alignment mark 40 is far larger than the wavelength of an incident light beam, the polarization of the beam is of less influence on its diffraction efficiency. However, for an incident light beam whose wavelength is of the same order of magnitude as the grating period of the alignment mark 40, the polarization characteristics of the incident light beam will greatly affect the grating diffraction efficiency. Specifically, when a linear polarized light beam is employed, there is a risk that the grating has a sharp decline in diffraction efficiency under this direction of polarization. Herein, the employment of the circularly polarized incident beams will prevent the said risk, as the circularly polarized incident beam is composed of two linearly polarized components with mutually perpendicular directions of polarization, and hence there is always a component which can ensure high diffraction efficiency of the grating. Therefore, the employment of the circularly polarized incident beams to illuminate the alignment mark can provide the alignment system with a high adaptability to small-period alignment marks.

The re-diffracted beams 101f and 102f are collected by the lens 28 and are then passed by the third quarter-wave plate 26 so as to be converted to P-polarized beam 101g and S-polarized beam 102g, respectively. The P-polarized beam 101g successively passes through the polarization beam splitter 21 and the second quarter-wave plate 24, and is then reflected by the cube-corner prism 25 back to the second quarter-wave plate 24 and thereby converted to an S-polarized beam 101h. At the same time, the S-polarized beam 102g is reflected by the polarization beam splitter 21, passes through the first quarter-wave plate 22, further reflected by the first reflector 23, and converted into a P-polarized beam 102h after it passes again through the first quarter-wave plate 22. The beams 101h and 102h are then respectively subjected to reflection and transmission at the same position of the polarization beam splitter 21 and exit the polarization beam splitter 21 from a left side face thereof as output light beams I101 and I102. The output light beams I101 and I102 pass through the lens group 31. At this time, as directions of polarization of the output light beams I101 and I102 are perpendicular to each other, no interference occurs. Afterward, the output light beams I101 and I102 are passed by the polarizing means 32 which synchronizes their directions of polarization and thus causes their mutual interference, generating an interference signal $I_t$.

The interference signal $I_i$ is transferred by the optical fiber 33 to the photoelectric detector 34, and the photoelectric detector 34 then determines the position of the alignment mark based on a phase variation of the interference signal $I_i$.

Figure 3:
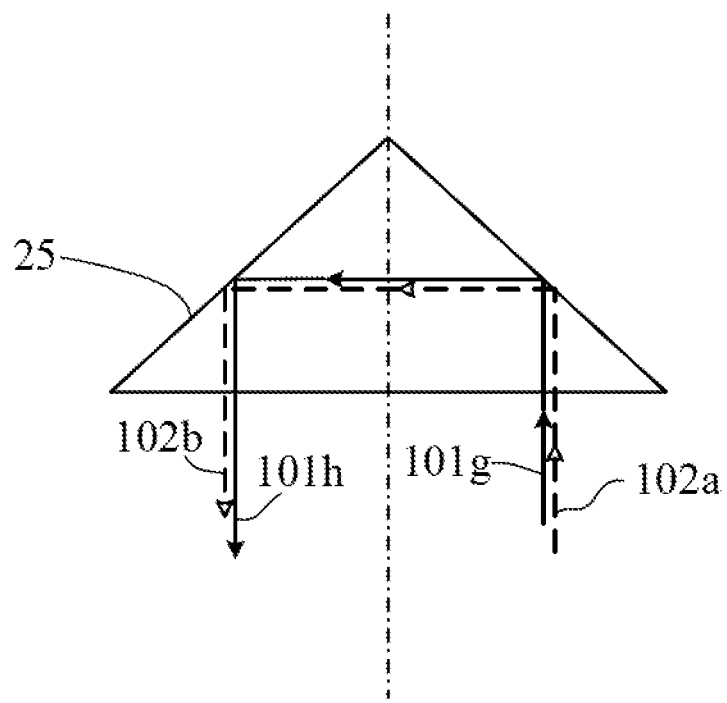
FIG. 3 depicts simplified optical paths in a cube-corner prism.
Figure 4:
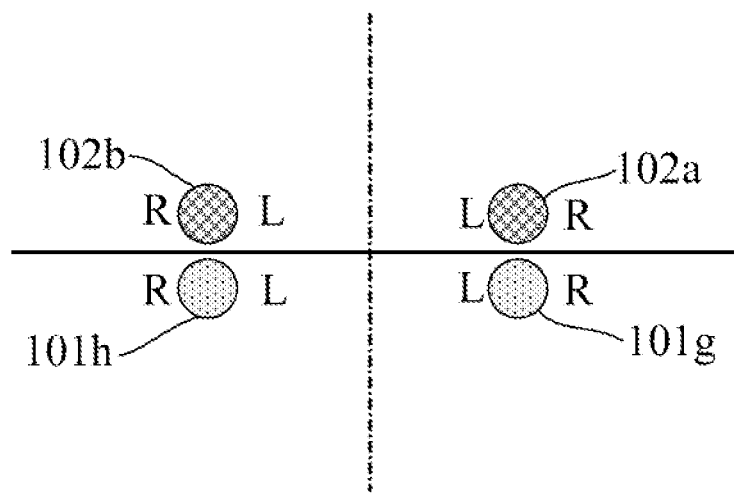
FIG. 4 is a top view of FIG. 3.

More specifically, as shown in FIGS. 3 and 4, the cube-corner prism 25 has three reflecting faces perpendicular to one another and a bottom in the shape of an equilateral triangle. Such structure of the prism allows a light beam coming in from the bottom in any direction to be successively reflected by the three reflecting faces and exit from the bottom in a direction exactly opposite to the direction along which it entered the prism (the optical paths within the cube-corner prism 25 shown in the figure are simplified representations of this mechanism). The cube-corner prism 25 is included in the alignment system to accomplish the following two functions: on one hand, it realizes the symmetrical reflection of the beams. Specifically, the incoming beam 102a is converted into the reflected beam 102b by the cube-corner prism 25, where the beam 102a travels in a direction opposed to that of the beam 102b and at a position symmetrical to that of the beam 102b with respect to a center of the bottom of the cube-corner prism 25. As the center of the cube-corner prism 25 is located on the optical axis of the lens 28, the beams 102a and 102b are symmetrical with respect to the optical axis of the lens 28, assuring the beams 101d and 102d to be incident on the alignment mark 40 at the same angle. On the other hand, the cube-corner prism 25 realizes the 180° rotation of the beams. Firstly, the beam 102a is rotated by 180° and thereby converted into the beam 102b, and then the beam 101g generating from a precursor beam that has undergone the re-diffraction by the alignment mark 40 is rotated by 180° and thereby converted into the beam 101h. Since the beam 102g generated from the re-diffraction of the beam 102b by the alignment mark 40 is not rotated, the output beams 101h and 102h exiting from the left side face of the polarization beam splitter 21 have no relative rotation. Therefore, the original illumination light beam 100 is not required to have a strict spatial coherence.

Figure 5:
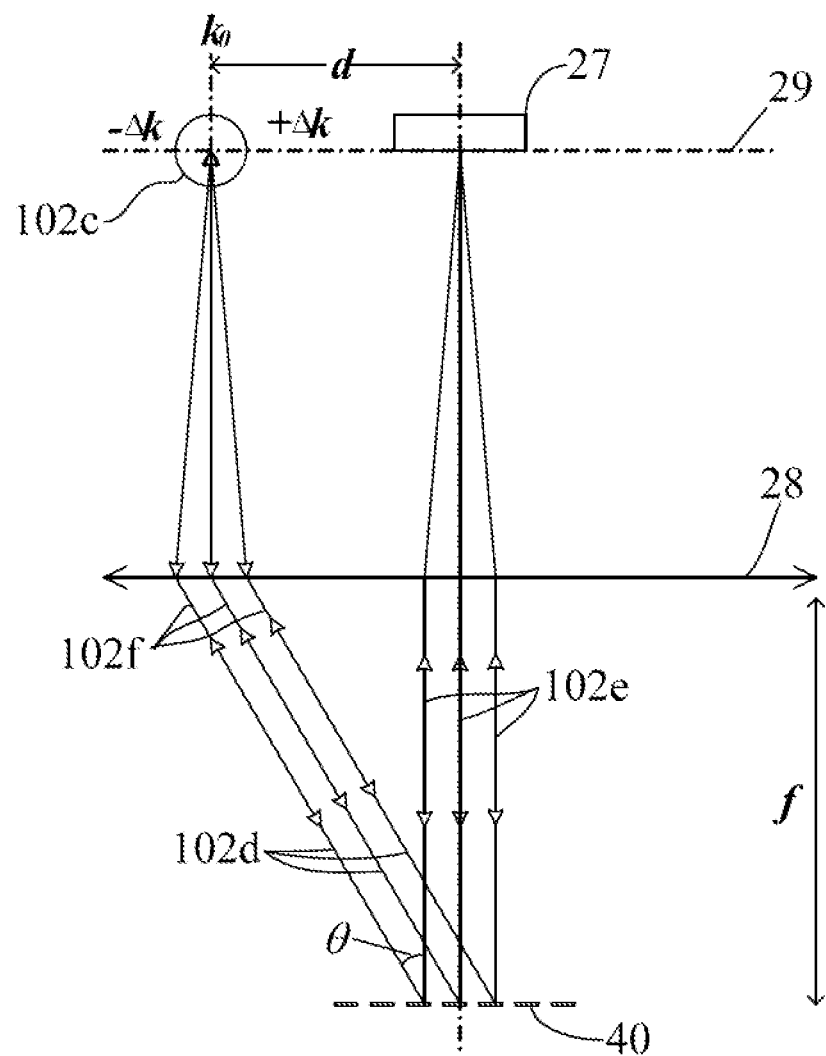
FIG. 5 depicts the principle of twice diffraction by an alignment mark.

Referring to FIG. 5, assuming that the beam 102c has a frequency band of 2Δk and is incident on the rear focal plane 29 of the lens 28 at a coordinate $k_0$, a focal length of the lens 28 is f, and a distance from a center of the beam 102c to the optical axis of the lens 28 is d, the angle of incidence θ of the beam 102d is given by:

$$\theta = \arctan\frac{d}{f} \quad (1)$$

It can be seen from this equation that adjusting d to such a value that the angle of incidence of the beam 102d is equal to the diffraction angle of a certain diffraction order of the alignment mark 40 can make the following grating equation satisfied:

$$\sin\theta = \pm\frac{n\lambda}{p} \quad (2)$$

where p is the period of the alignment mark, n is an integer, and λ is the wavelength of the beam 102c. In this circumstance, after the beam 102d is diffracted by the alignment mark 40, the emerging diffracted beam 102e of the n-th (or −n-th) order will be nearly parallel to the optical axis of the lens 28. After the beam 102e is converged onto the reflector 27 and is reflected thereby back to the lens 28, the reflected beam passes through the lens 28 and is then incident on the alignment mark 40 along a direction that is opposite to a direction of the diffracted beam 102e. On the alignment mark 40, the reflected beam is diffracted and generates the re-diffracted beam 102f. In an ideal case, the re-diffracted beam 102f exactly coincides with the incident beam 102d. The re-diffracted beam 102f carries information x indicative of the position of the alignment mark 40. The electric field $E_2(K_0)$ of the beam 102f is given by:

$$E_2(k_0) = A_0\exp\left(j2\pi\frac{2n}{p}x\right) \quad (3)$$

where $A_0$ is a normalization factor of the field and $k_0$ is a coordinate of a center of the field on a pupil plane (or referred to as a spectrum plane). This coordinate $k_0$ is coincident with the coordinate of the beam 102c on the rear focal plane 29 of the lens 28, the reason for which will be described in detail below. With similarity to the beam 102f, the electric field $E_1(-K_0)$ of the other beam 101f can be expressed as:

$$E_1(-k_0) = A_0\exp\left(-j2\pi\frac{2n}{p}x\right) \quad (4)$$

After the beams 101f and 102f are passed by the polarizing means 32, the intensity of the generated interference signal $I_i$ can be calculated according to:

$$I_i = \frac{1}{2}|E_1|^2 + \frac{1}{2}|E_2|^2 + \frac{1}{2}E_1E_2^* + \frac{1}{2}E_1^*E_2 \quad (5)$$
$$= A_0^2 + A_0^2\cos\left(2\pi\frac{4n}{p}x\right)$$

The equation (5) implies that the period of the interference signal $I_i$ is ¼n of that of the alignment mark. That is, the optical magnification of the alignment system is 4n, double of the optical magnification of the conventional alignment systems. This also means that the alignment system has a doubled resolution for the same used diffraction order.

Moving the alignment mark 40 in the X direction can result in a scanning curve of the interference signal $I_i$ in the X direction. Phase of the signal $I_i$ can be extracted out from fitting the curve using a computer as $\phi_i=2\pi\cdot4nx/p$, from which the position of the alignment mark can be calculated using:

$$x = \frac{\varphi_i}{2\pi}\cdot\frac{p}{4n} \quad (6)$$

When the center of symmetry of the alignment mark 40 coincides with the optical axis of the lens 28, i.e., x=0, the alignment mark 40 is aligned to a target position.

Figure 6:
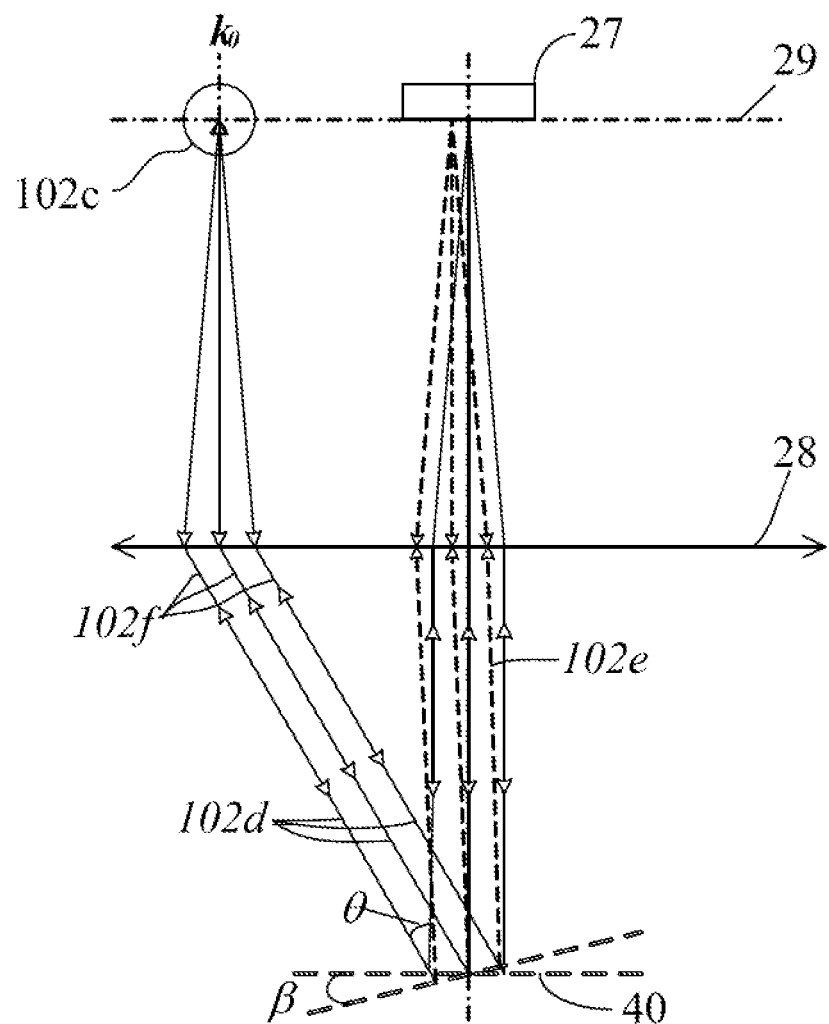
FIG. 6 depicts optical paths associated with the twice diffraction when the alignment mark is tilted.

Referring to FIG. 6, when the alignment mark is tilted over an angle β, the beam 102d will be inclined with respect to the normal of the alignment mark 40 at an angle θ-β. As indicated in FIG. 6 by dashed lines, the angle α of the diffracted beam 102e to the normal will be:

$$\alpha = \arcsin\left(\frac{n\lambda}{p} - \sin(\theta - \beta)\right) \quad (7)$$

After the diffracted beam 102e is reflected by the reflector 27 and passed by the lens 28, it travels along the original path in an opposite direction onto the alignment mark 40, whereby it is diffracted for a second time, and the emerging re-diffracted beam 102f has an angle α' to the normal of the alignment mark, which can be calculated from the grating equation according to:

$$\alpha' = \arcsin\left(\frac{n\lambda}{p} - \sin\alpha\right) = \theta - \beta \quad (8)$$

From the equation (8), it can be understood that the re-diffracted beam 102f totally coincides with the incident beam 102d, and there is no change in the position of the light spot formed on the rear focal plane 29 of the lens 28, suggesting no influence of tilting of the alignment mark 40 on the alignment results.

Figure 7:
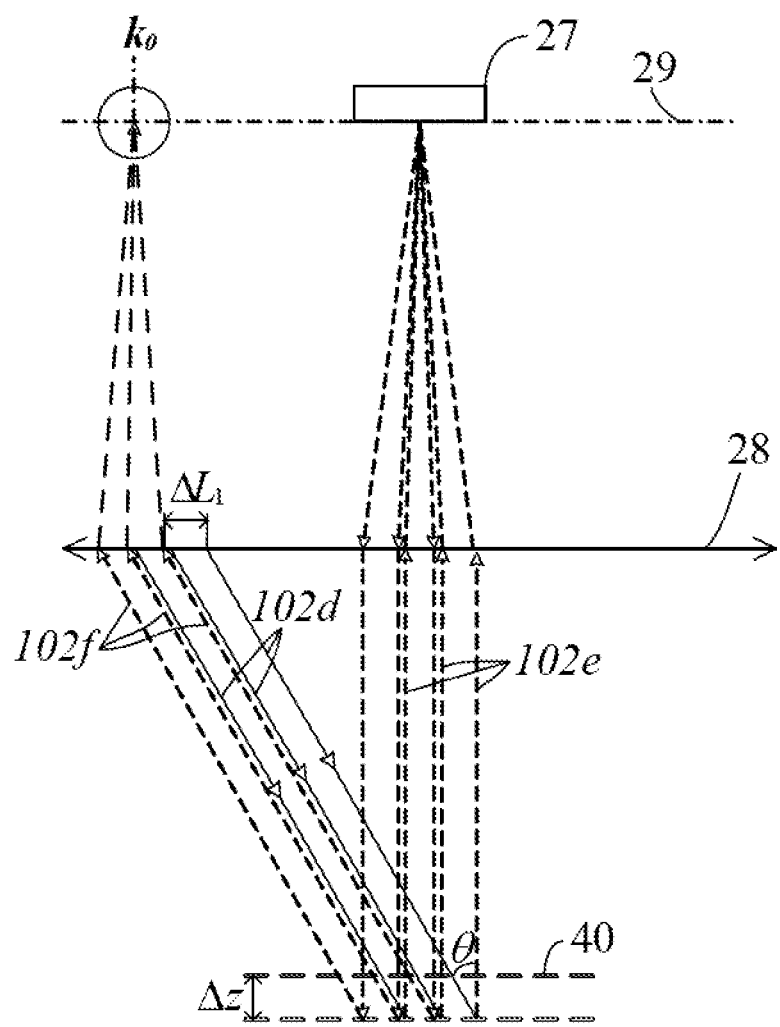
FIG. 7 depicts optical paths associated with the twice diffraction when the alignment mark is defocused.

Referring now to FIG. 7, when the alignment mark 40 has a defocus Δz, i.e., the alignment mark 40 is not on the front focal plane of the lens 28, the incident beam 102d will be horizontally deviated by an amount of Δz tan θ on the alignment mark 40. The emerging diffracted beam 102e is denoted by dashed lines in the figure. As a result, the re-diffracted beam 102f has a horizontal deviation ΔL₁=2Δz tan θ from the incident beam 102d to the opposite direction. After the re-diffracted beam 102f is collected by the lens 28, there is no change in the position of the formed light spot on the rear focal plane 29. Thus, defocusing of the alignment mark 40 does not affect the alignment results either.

Figure 8:
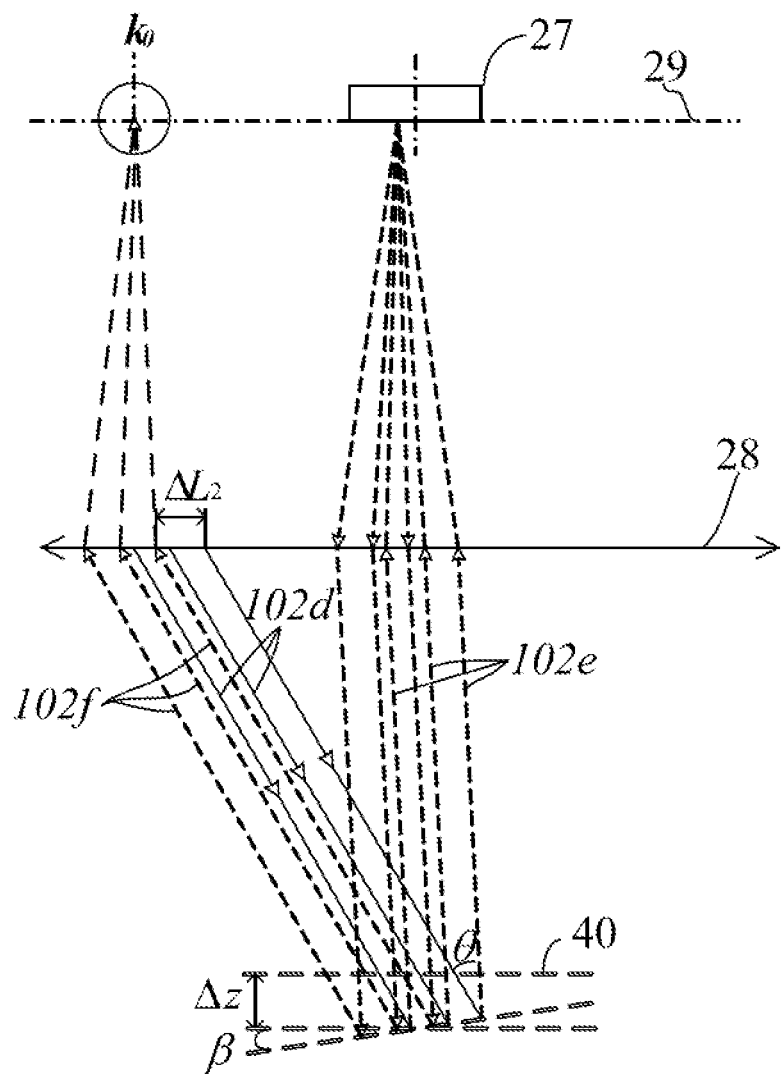
FIG. 8 depicts optical paths associated with the twice diffraction when the alignment mark is simultaneously tilted and defocused.

Referring to FIG. 8, when the alignment mark 40 is associated with both the tilt angle β and the defocus Δz, the horizontal deviation of the re-diffracted beam 102f from the incident beam 102d can be calculated according to the grating equation and the relevant geometric relations as ΔL₂=2Δz(tan θ− tan δ), where δ represents the angle between the beam 102e and the optical axis of the lens 28 and there is the relation δ=arcsin [nλ/p−sin(θ−β)]+β. As the re-diffracted beam 102f is opposite in direction to the beam 102d, after collected by the lens 28, there is no change in the light spot position on the rear focal plane 29, demonstrating that tilting-defocusing of the alignment mark does not affect the alignment results either.

From the foregoing description, it can be found that in this twice-diffraction design, even the alignment mark is tilted and/or defocused, the re-diffracted beam will always return to the lens, following the path of the incident beam and traveling in the opposite direction. According to an inherent characteristic of the lens, as long as the re-diffracted beam travels in the opposite direction to the direction of the incident beam, there will be no change in the position of the light spot formed on the rear focal plane after the re-diffracted beam passes through the lens, even when horizontal deviations of the beams have been caused by the tilting or defocusing of the alignment mark. Therefore, the alignment results will not be affected by the tilting and/or defocusing of the alignment mark.

Preferably, the beam splitter 12 is a grating beam splitter, a fiber-optic beam splitter, or a planar light-wave circuit splitter. Specifically, in order to realize multiple-order detections, multiple illumination light beams may be introduced through a side face into the beam splitter and split into multiple incident beams by the beam splitter 12, thereby realizing multiple-order detections.

Figure 9:
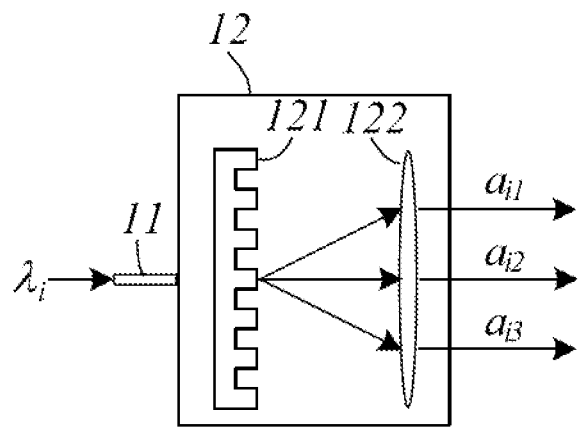
FIG. 9 illustrates how a grating beam splitter works.

As shown in FIG. 9, the beam splitter 12 may be a grating beam splitter which includes a transmission phase grating 121 and a collimator lens 122. An intensity ratio of output beams $\alpha_{i1}$, $\alpha_{i2}$ and $\alpha_{i3}$ is adjustable by manipulating parameters of the splitter, such as, for example, the period or groove depth.

Figure 10:
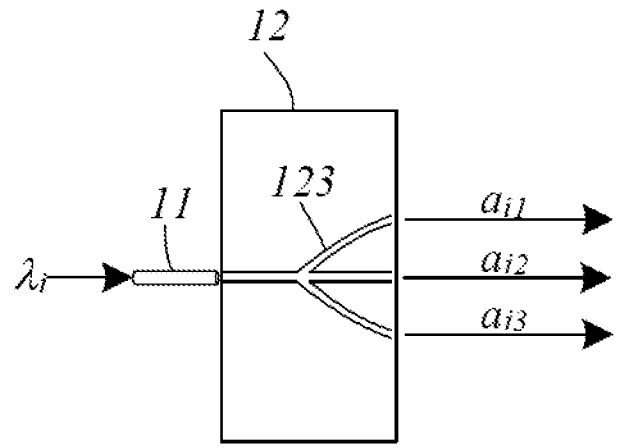
FIG. 10 illustrates how a fiber-optic beam splitter works.

As shown in FIG. 10, the beam splitter 12 may be a fiber-optic beam splitter. In this illustrated example, the fiber-optic beam splitter is a fused biconical taper splitter 123, which can be made by using a tapering machine to stretch a bundle of optical fibers in a fused state. During the stretching process, a splitting ratio of the fibers is monitored and the process is terminated as soon as the desired ratio is reached. On one side of the bundle, only the end portion of one fiber is retained (those of the rest are all removed) to serve as an input side, and the other side of the bundle is kept intact for serving as a multi-output side.

Figure 11:
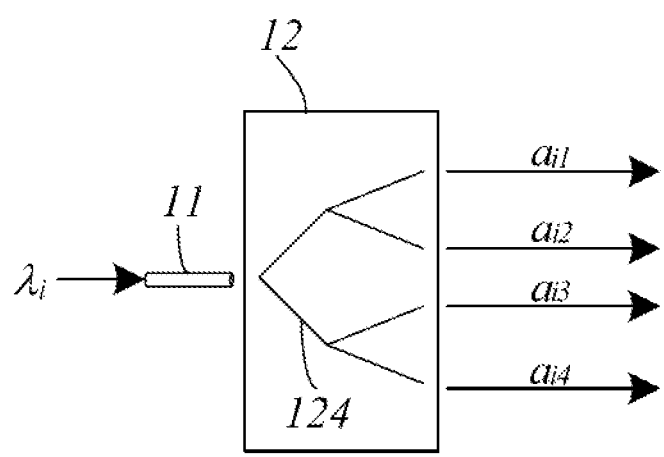
FIG. 11 illustrates how a planar light-wave circuit splitter works.

As shown in FIG. 11, the beam splitter 12 may be a planar light-wave circuit splitter. The splitter incorporates a chip 124 for splitting a light beam. According to the above equations (1) and (2), the distance of each split sub-beam from the axis of the lens 28 on the rear focal plane 29 of the lens is required to satisfy the following equation:

$$\arctan\frac{d}{f} = \arcsin\left(\pm\frac{n\lambda}{p}\right) \quad (9)$$

Figure 12:
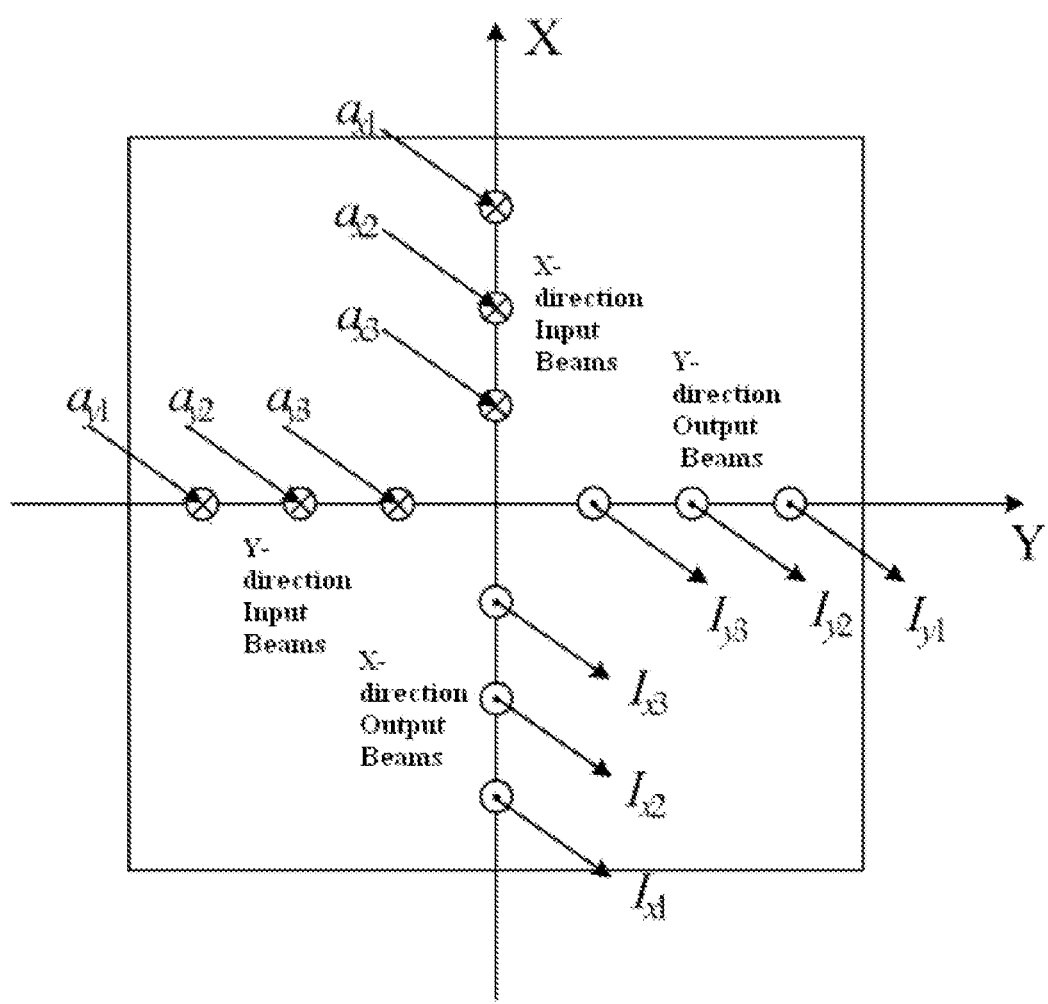
FIG. 12 depicts an elevation view of an input/output side face of a polarization beam splitter used in two-directional alignment.

Referring to FIG. 12, in order to achieve alignment in both the X and Y directions, on the input/output side face of the polarization beam splitter 21, input beams $\alpha_{x1}$, $\alpha_{x2}$ and $\alpha_{x3}$ with different wavelengths and of different diffraction orders are supplied to the X direction and are in 180-degree rotational symmetry with the corresponding respective output beams $I_{x1}$, $I_{x2}$ and $I_{x3}$, and similarly, input beams $\alpha_{y1}$, $\alpha_{y2}$ and $\alpha_{y3}$ are supplied to the Y direction and are in 180-degree rotational symmetry with the corresponding respective output beams $I_{y1}$, $I_{y2}$ and $I_{y3}$.

Embodiment 2

This embodiment differs from the Embodiment 1 in using a dual-frequency laser as the light source and a laser frequency divider as the beam splitter 52. Preferably, the laser frequency divider is an electro-optic modulator or an acousto-optic modulator.

Figure 13:
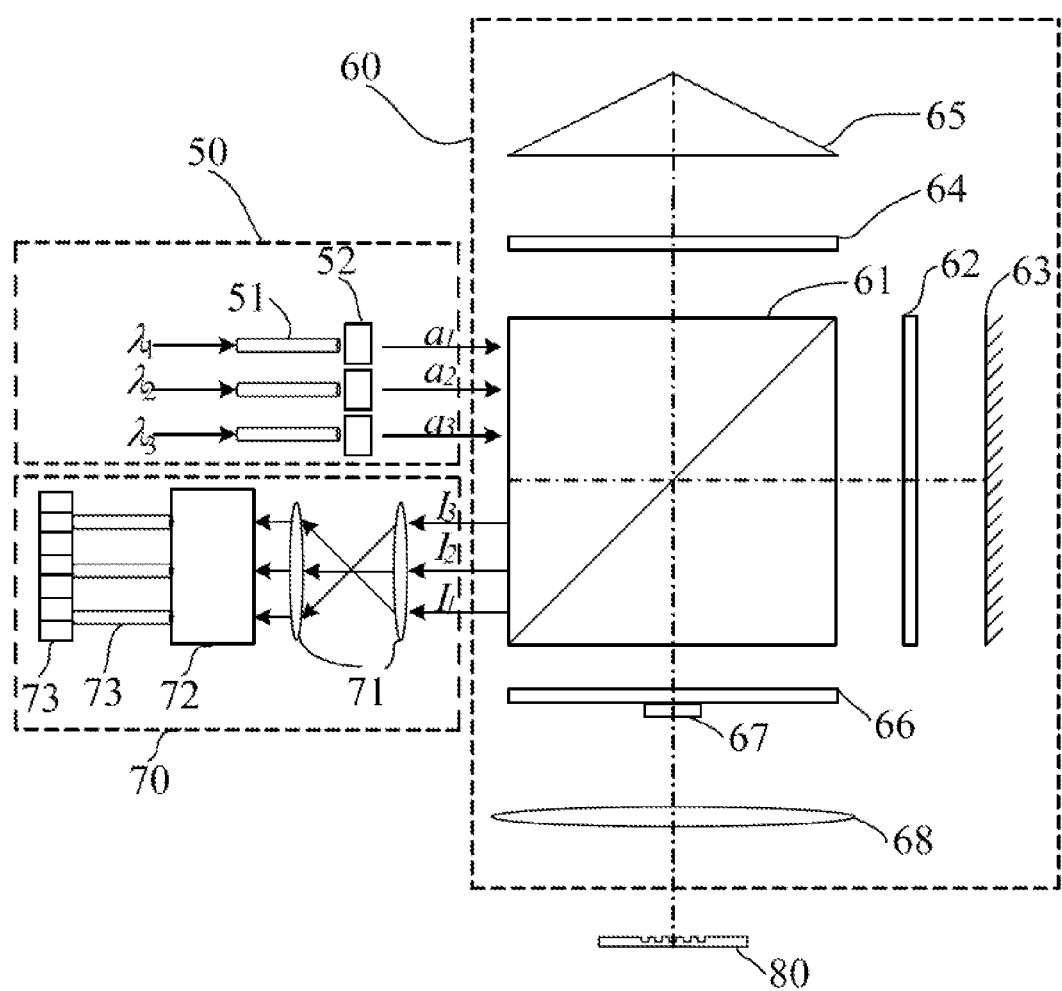
FIG. 13 is a schematic illustrating an off-axis alignment system in accordance with a second embodiment of the present invention.

As shown in FIG. 13, the off-axis alignment system according to the present invention includes: an illumination module 50, an interference module 60 and a detection module 70. The illumination module 50 and the detection module 70 are located on the same side of the interference module 60. The illumination module 50 includes a light source (not shown), a multi-wavelength incident optical fiber 51 and the beam splitter 52. In embodiment 2, the light source is implemented as a dual-frequency laser, and the beam splitter 52 as a laser frequency divider. Specifically, the laser frequency divider is an electro-optic modulator or an acousto-optic modulator. The interference module 60 includes a polarization beam splitter 61. On a side of the polarization beam splitter 61 opposite to the side thereof on which the illumination module 50 and the detection module 70 are located, sequentially disposed are a first quarter-wave plate 62 and a first reflector 63. In addition, on two further sides of the polarization beam splitter 61, respectively disposed are a second quarter-wave plate 64 and a cube-corner prism 65 sequentially, and a third quarter-wave plate 66, a second reflector 67 and a lens 68 sequentially. The second reflector 67 is situated on a rear focal plane of the lens 68, and an alignment mark 80 is arranged on the other side of the lens 68. A center of a bottom of the cube-corner prism 65 is on an optical axis of the lens 68. The detection module 70 successively includes a lens group 71, a polarizing means 72, a detection optical fiber 73 and a photoelectric detector 74. Light beams emanating from the illumination module 50 are diffracted twice in the interference module 60 and thereby form interference signals comprising indications about the position of the alignment mark 80. The signals are then incident on the detection module 70 which then determines information indicative of the position of the alignment mark based on phase variations of the interference signals.

The laser frequency divider can divide a laser beam into two beams with a frequency difference ω and mutually perpendicular directions of polarization. In one embodiment, the laser frequency divider is implemented as an electro-optic modulator (EOM), and the principle of operation is that the light source supplies a linearly polarized beam $E_{in}$ whose direction of polarization is rotated over 45° with respect to the fast axis of the EOM. When the EMO is supplied with a half-wave voltage $V_{\lambda/2}$ having an angular frequency ω, the electric field $E_{out}$ of the output light can be described using Jones vectors, i.e., a planar vector field is represented by a column matrix of two orthogonal elements:

$$E_{out} = EOM(\omega t) \cdot E_{in} \propto \begin{pmatrix} e^{i\omega t/2}, & 0 \\ 0, & e^{-i\omega t/2} \end{pmatrix} \begin{pmatrix} 1 \\ 1 \end{pmatrix} = \begin{pmatrix} e^{i\omega t/2} \\ e^{-i\omega t/2} \end{pmatrix} \quad (10)$$

The electric field $E_{out}$ comprises horizontally and vertically polarized electric fields $E_{ox}$ and $E_{oy}$, and after it is passed by the beam splitter 61, corresponding reflected and transmitted beams emerge, which subsequently undergo the same transmission, diffraction and interference processes as described in the Embodiment 1. The resulting signal is expressed as:

$$I_i(k_0) = A_0^2 + A_0^2 \cos\left(\omega t + 2\pi \frac{4n}{p} x\right) \quad (11)$$

When the angular frequency ω is known, the phase of the signal can be obtained from demodulating the signal expressed by equation (11) as $\phi_i = 2\pi \cdot 4nx/p$, from which the position of the alignment mark can be calculated.

In summary, the present invention provides an off-axis alignment system and an off-axis alignment method thereof. The system includes an illumination module, an interference module and a detection module. The illumination and detection modules are located on the same side of the interference module. The illumination module includes a light source, a multi-wavelength incident optical fiber and a beam splitter. The interference module includes a polarization beam splitter. On a side of the polarization beam splitter opposite to the side thereof on which the illumination and detection modules are located, sequentially disposed are a first quarter-wave plate and a first reflector. On two further sides of the polarization beam splitter, respectively disposed are a second quarter-wave plate and a cube-corner prism sequentially, and a third quarter-wave plate, a second reflector and a lens sequentially. The second reflector is situated on a rear focal plane of the lens, and an alignment mark is arranged on the other side of the lens. A center of a bottom of the cube-corner prism is situated on an optical axis of the lens. The detection module sequentially includes a lens group, a polarizing means, a detection optical fiber and a photoelectric detector. A beam emanating from the illumination module is diffracted twice in the interference module and thereby forms an interference signal comprising an indication about the position of the alignment mark. The interference signal is incident on the detection module which determines information indicative of the position of the alignment mark based on a phase variation in the interference signal. The present invention can address the problems encountered by the conventional systems, including the vulnerability of alignment results to tilting or defocusing of the alignment mark, necessary use of an illumination beam with high spatial coherence, and lack of practicability due to the use of optical wedges and other complex components.

Obviously, those skilled in the art may make various modifications and alterations without departing from the spirit and scope of the invention. It is therefore in-tended that the invention be construed as including all such modifications and alterations insofar as they fall within the scope of the appended claims or equivalents thereof.

What is claimed is:

1. An off-axis alignment system comprising, sequentially along a transmission path of a light beam, an illumination module, an interference module and a detection module, wherein:
    the illumination module comprises a light source, a multi-wavelength incident optical fiber and a beam splitter,
    the detection module sequentially comprises a lens group, a polarizing means, a detection optical fiber and a photoelectric detector, and
    the interference module comprises:
        a polarization beam splitter having four side faces, the illumination module and the detection module both located on a first side of the polarization beam splitter;
        a first quarter-wave plate and a first reflector, sequentially disposed on a second side of the polarization beam splitter opposite to the first side thereof;
        a second quarter-wave plate and a cube-corner prism, sequentially disposed on a third side of the polarization beam splitter; and
        a third quarter-wave plate, a second reflector and a lens, sequentially disposed on a fourth side of the polarization beam splitter opposite to the third side thereof, the second reflector located on a rear focal plane of the lens, a center of a bottom of the cube-corner prism situated on an optical axis of the lens.

2. The off-axis alignment system of claim 1, wherein the illumination module further comprises a shutter, an optical isolator and a phase modulator.

3. The off-axis alignment system of claim 1, wherein the light source is a laser.

4. The off-axis alignment system of claim 3, wherein the light source supplies light comprising at least four different wavelengths, two of which are in infrared spectrum.

5. The off-axis alignment system of claim 3, wherein the light source is a single-frequency laser, and the beam splitter is one selected from the group consisting of a grating beam splitter, a fiber-optic beam splitter and a planar light-wave circuit splitter.

6. The off-axis alignment system of claim 3, wherein the light source is a dual-frequency laser, and the beam splitter is a laser frequency divider.

7. The off-axis alignment system of claim 6, wherein the laser frequency divider is an electro-optic modulator or an acousto-optic modulator.

8. The off-axis alignment system of claim 1, wherein the polarizing means is one selected from the group consisting of a dichroic polarizer, a multilayer-coating based regular polarization beam splitter and a birefringent beam splitter.

9. An off-axis alignment method using the off-axis alignment system according to claim 1, the method comprising the steps of:

emitting a laser beam with the light source, using the beam splitter to split the laser beam into illumination beams with a plurality of wavelengths and of a plurality of orders, directing the illumination light beams onto the polarization beam splitter such that each illumination light beam is split into a first sub-beam and a second sub-beam, respectively reflecting the first and second sub-beams with the first reflector and the cube-corner prism such that the reflected first and second sub-beams are symmetrical to each other with respect to the optical axis of the lens, and passing the symmetrical first and second sub-beams through the lens such that the symmetrical first and second sub-beams are incident on an alignment mark at a same angle of incidence and are diffracted by the alignment mark for a first time;

passing the diffracted sub-beams through the lens, reflecting the diffracted sub-beams with the second reflector located on the rear focal plane of the lens, and directing the reflected diffracted sub-beams again onto the alignment mark such that the reflected diffracted sub-beams are diffracted by the alignment mark for a second time;

collecting the re-diffracted sub-beams with the lens, passing the re-diffracted sub-beams through the polarization beam splitter, the cube-corner prism and the first reflector, and making the re-diffracted sub-beams mutually superimposed at a same location on an interface of the polarization beam splitter to generate an interference signal; and passing the interference signal through the lens group and the polarizing means to the photoelectric detector and using the photoelectric detector to determine a position of the alignment mark based on a phase variation of the interference signal.

10. The method of claim 9, wherein the illumination module further comprises a shutter, an optical isolator and a phase modulator.

11. The method of claim 9, wherein the light source is a laser.

12. The method of claim 11, wherein the light source supplies light comprising at least four different wavelengths, two of which are in infrared spectrum.

13. The method of claim 11, wherein the light source is a single-frequency laser, and the beam splitter is one selected from the group consisting of a grating beam splitter, a fiber-optic beam splitter and a planar light-wave circuit splitter.

14. The method of claim 11, wherein the light source is a dual-frequency laser, and the beam splitter is a laser frequency divider.

15. The method of claim 14, wherein the laser frequency divider is an electro-optic modulator or an acousto-optic modulator.

16. The method of claim 9, wherein the polarizing means is one selected from the group consisting of a dichroic polarizer, a multilayer-coating based regular polarization beam splitter and a birefringent beam splitter.

\* \* \* \* \*